(12) United States Patent
Shaw et al.

(10) Patent No.: US 9,238,349 B2
(45) Date of Patent: Jan. 19, 2016

(54) THIN DIAMOND FILM BONDING PROVIDING LOW VAPOR PRESSURE AT HIGH TEMPERATURE

(71) Applicants: Jonathan L. Shaw, Springfield, VA (US); Jeremy Hanna, Fairfax, VA (US)

(72) Inventors: Jonathan L. Shaw, Springfield, VA (US); Jeremy Hanna, Fairfax, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/306,062

(22) Filed: Jun. 16, 2014

(65) Prior Publication Data

US 2015/0044497 A1  Feb. 12, 2015

Related U.S. Application Data

(60) Provisional application No. 61/864,854, filed on Aug. 12, 2013.

(51) Int. Cl.

| | |
|---|---|
| C23C 14/06 | (2006.01) |
| B32B 9/00 | (2006.01) |
| B32B 9/04 | (2006.01) |
| B32B 15/04 | (2006.01) |
| B32B 37/12 | (2006.01) |
| B32B 37/24 | (2006.01) |

(Continued)

(52) U.S. Cl.
CPC ............... *B32B 9/007* (2013.01); *B32B 9/041* (2013.01); *B32B 15/043* (2013.01); *B32B 37/12* (2013.01); *B32B 37/24* (2013.01); *B32B 38/0036* (2013.01); *B32B 38/1858* (2013.01); *H01J 1/34* (2013.01); *B32B 2037/246* (2013.01); *B32B 2038/0052* (2013.01); *B32B 2250/05* (2013.01); *B32B 2309/68* (2013.01); *B32B 2311/00* (2013.01); *B32B 2311/09* (2013.01); *B32B 2311/16* (2013.01); *B32B 2313/04* (2013.01); *Y10T 428/12542* (2015.01)

(58) Field of Classification Search
USPC ........ 156/285; 228/121.1, 221; 427/122, 123, 427/125, 404
See application file for complete search history.

(56) References Cited

U.S. PATENT DOCUMENTS

| | | | |
|---|---|---|---|
| 7,926,695 B2 * | 4/2011 | Hagen .................. | B23K 1/19 228/122.1 |
| 2010/0206941 A1 * | 8/2010 | Egan .................. | C09K 3/1445 228/221 |

FOREIGN PATENT DOCUMENTS

| | | |
|---|---|---|
| EP | 0440384 | 8/1991 |
| JP | 2004091250 | 3/2004 |

(Continued)

OTHER PUBLICATIONS

Shaw, J. L., et al. "Development of a diamond transmitted secondary electron source." Vacuum Nanoelectronics Conference (IVNC), 2012 25th International. IEEE, 2012.

(Continued)

*Primary Examiner* — A. A. Turner
(74) *Attorney, Agent, or Firm* — US Naval Research Laboratory; Stephen T. Humnius

(57) ABSTRACT

This disclosure concerns bonding a thin film of diamond to a second thick diamond substrate in a way that does not cause the exposed (un-bonded) diamond surface to become contaminated by the bonding process or when the bonded diamond is held at high temperature for many hours in vacuum.

15 Claims, 3 Drawing Sheets

(51) Int. Cl.
*B32B 38/00* (2006.01)
*B32B 38/18* (2006.01)
*H01J 1/34* (2006.01)

(56) References Cited

FOREIGN PATENT DOCUMENTS

| | | |
|---|---|---|
| JP | 2007051327 | 3/2007 |
| JP | 2010222172 | 10/2010 |
| KR | 1020100027146 | 3/2010 |

OTHER PUBLICATIONS

Shaw, J. L., et al. "Images of electron transmission through thin diamond films." Vacuum Nanoelectronics Conference (IVNC), 2011 24th International. IEEE, 2011.

Shaw, Jonathan L., et al. "Diamond bonding and metallization for electron transmission cathodes." Vacuum Electron Sources Conference (IVESC), 2012 IEEE Ninth International. IEEE, 2012.

Shaw, J. L., et al. "9.3: Sub-bandgap photoemission correlated with adsorbed molecules and bulk impurities in diamond." Vacuum Nanoelectronics Conference (IVNC), 2010 23rd International. IEEE, 2010.

Sun, Tianyin, et al. "Combined visible light photo-emission and low temperature thermionic emission from nitrogen doped diamond films." Applied Physics Letters 99.20 (2011): 202101.

Sun, Tianyin, et al. "Interface and interlayer barrier effects on photo-induced electron emission from low work function diamond films." Diamond and Related Materials 44 (2014): 123-128.

Yater, Joan E., et al. "Development of biased diamond current amplifier." Vacuum Electron Sources Conference (IVESC), 2012 IEEE Ninth International. IEEE, 2012.

* cited by examiner

THIN DIAMOND FILM BONDING PROVIDING LOW VAPOR PRESSURE AT HIGH TEMPERATURE

This application claims priority to and the benefits of U.S. Patent Application No. 61/864,854 filed on Aug. 12, 2013, the entirety of which is herein incorporated by reference.

BACKGROUND

This disclosure concerns a method of bonding a thin film of diamond to a second thick diamond substrate in a way that does not cause the exposed (un-bonded) diamond surface to become contaminated by the bonding process or when the bonded diamond is held at high temperature for many hours in vacuum.

In addition, this process allows the thin film diamond to be bonded over a hole in the substrate diamond.

In addition, the process provides a metal surface suitable for wire bonding on the surface of the thick diamond substrate adjacent to the thin film diamond but electrically isolated from it.

In addition, the process provides a bond material that is inert enough to withstand subsequent processing such as photo-resist development and most chemical etches.

Common bonding methods include thermo-compression bonding and brazing. Thermo-compression bonding requires application of very high pressure at high temperature, and is thus difficult to accomplish for a fragile part. More fundamentally, metals such as Au, that are most commonly used for thermo-compression bonding, exhibit fast surface diffusion, which could create an electric short circuit and/or contaminate the NEA surface.

Brazing requires that a filler metal be melted to create the bond, such that the melting point of the metal must be well above the intended operating temperature. However, the vapor pressures of suitable metals at their melting points are high enough to contaminate the diamond. When contaminated with metals at high temperature, the diamond typically reacts with the metal, forming metal carbides that are relatively inert and difficult to remove chemically without also removing the bond metal. For example, braze tests using Cu:Ag (72:28 wt %) eutectic alloy, which melts at 779° C., resulted in large amounts of both Cu and Ag on the exposed diamond surface, and these metals could not be completely removed using solutions that dissolve pure Cu and pure Ag. Other metals and alloys also have high vapor pressure at their melting points. Thus brazing is not an appropriate bonding method.

BRIEF SUMMARY OF THE INVENTION

The purpose of the invention is to bond a thin film of diamond to a second thick diamond substrate in a way that does not cause the exposed (un-bonded) diamond surface to become contaminated by the bonding process or when the bonded diamond is held at high temperature for many hours in vacuum.

In addition, the process allows the thin film diamond to be bonded over a hole in the substrate diamond.

In addition, the process provides a metal surface suitable for wire bonding on the surface of the thick diamond substrate adjacent to the thin film diamond but electrically isolated from it.

In addition, the process provides a bond material that is inert enough to withstand subsequent processing such as photo-resist development and most chemical etches.

DETAILED DESCRIPTION

Figure 1:
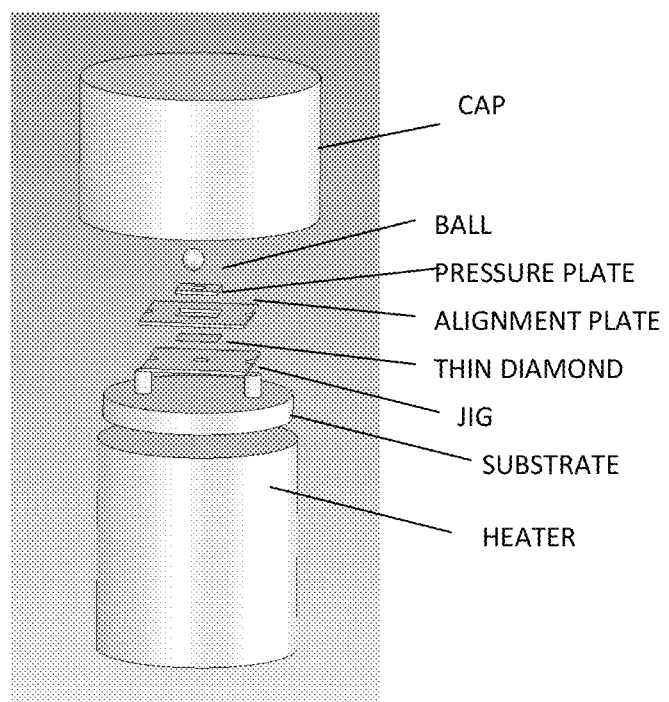
FIG. 1 illustrates a possible arrangement for the bonding method of thin film diamond.
Figure 2:
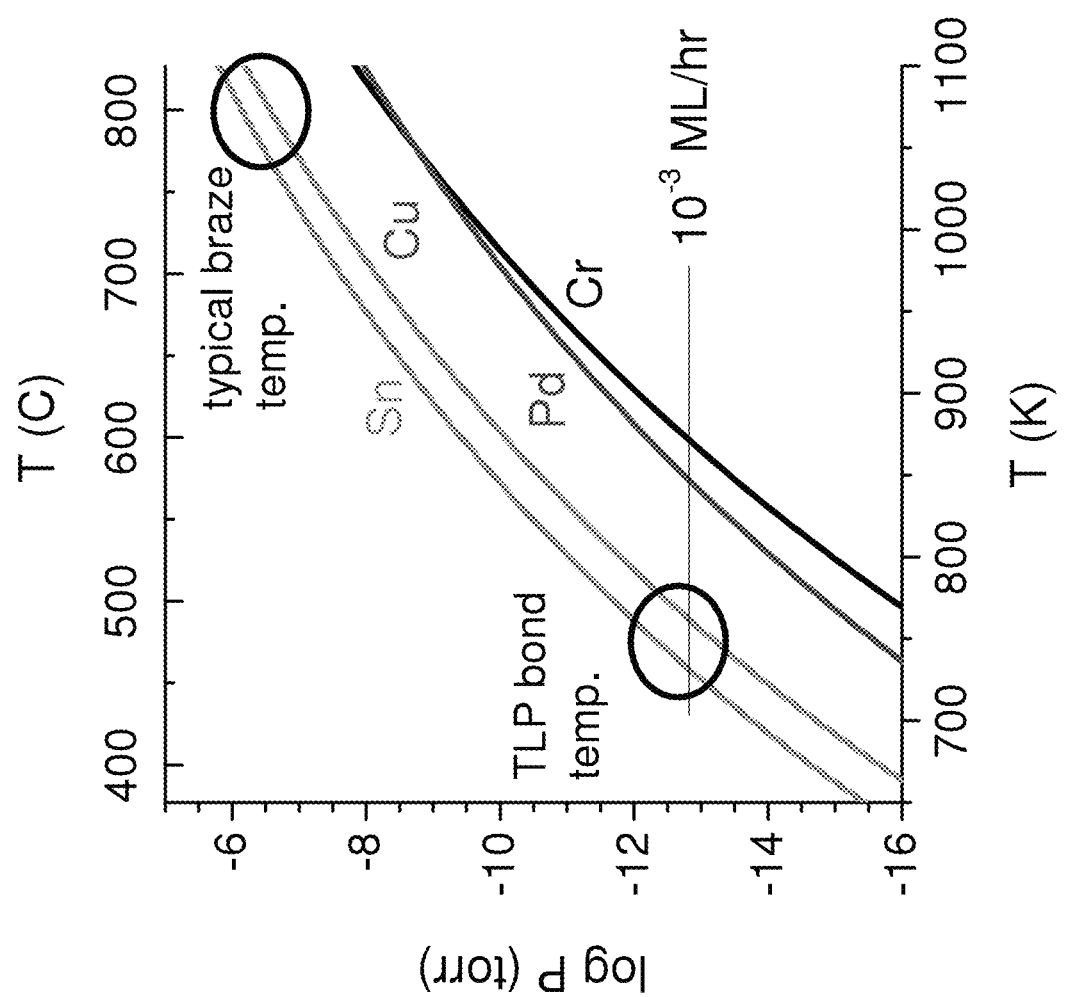
FIG. 2 illustrates vapor pressures of relevant metals.
Figure 3:
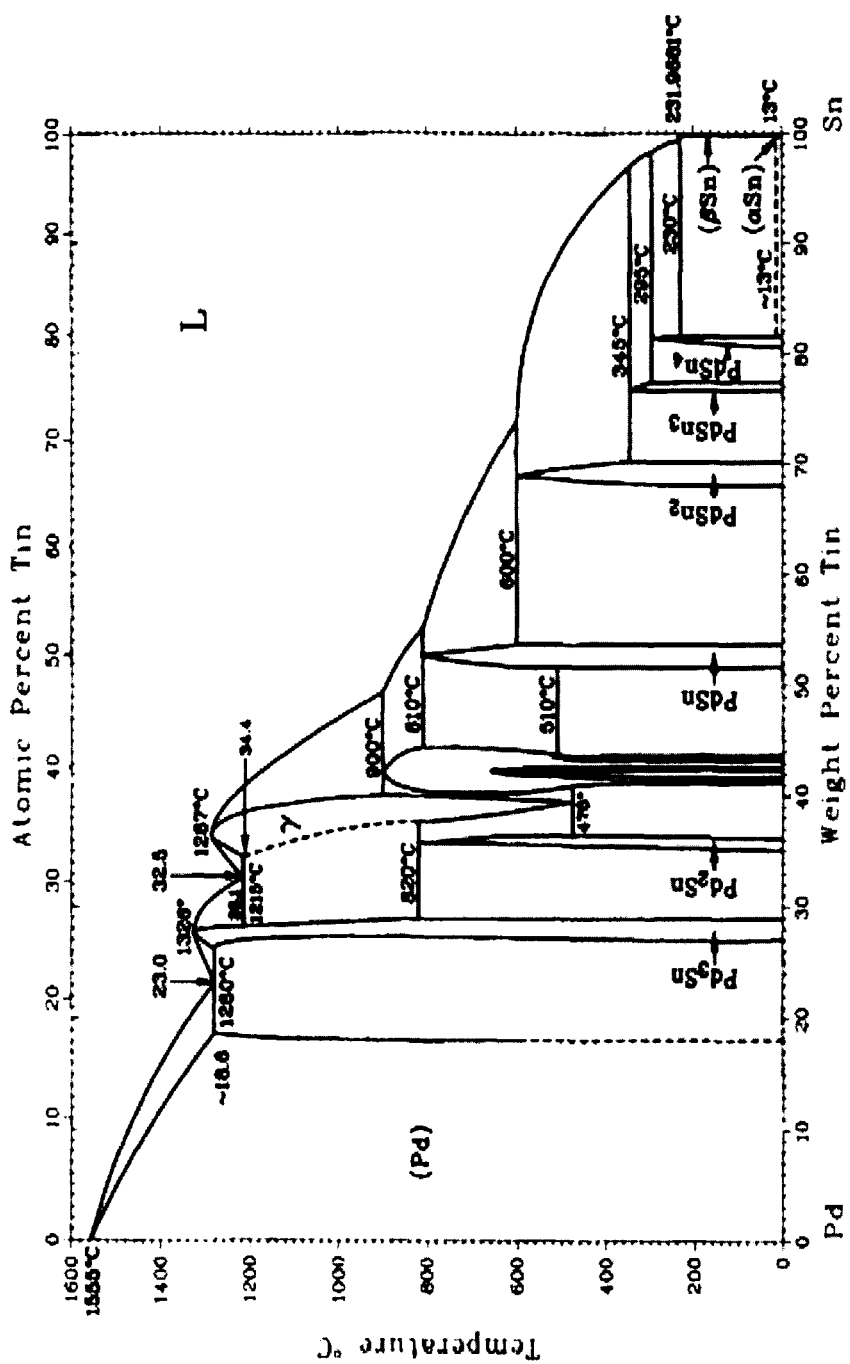
FIG. 3 illustrates weight percent of tin as a function of temperature.

This disclosure describes a method to bond a thin film of diamond to a second thick diamond substrate in a way that does not cause the exposed (un-bonded) diamond surface to become contaminated by the bonding process. Furthermore, this method avoids causing the exposed (un-bonded) diamond surface to become contaminated when the bonded diamond is held at high temperature for many hours in vacuum.

In addition, the process allows the thin film diamond to be bonded over a hole in the substrate diamond. In addition, the process provides a metal surface suitable for wire bonding on the surface of the thick diamond substrate adjacent to the thin film diamond but electrically isolated from it. In addition, the process provides a bond material that is inert enough to withstand subsequent processing such as photo-resist development and most chemical etches.

Diamond surfaces terminated with hydrogen atoms exhibit the property of negative electron affinity (NEA) and are also chemically stable, potentially making diamond a key material in electron sources.

A fraction of a single atomic layer of other atoms or molecules replacing or coating the hydrogen atoms on the diamond surface can degrade or destroy the NEA property; hence procedures to establish and maintain the hydrogen terminated surface free of contamination during use must be found in order to utilize NEA diamond in practice.

A particular type of electron source which has been called a "Thin diamond electron beam amplifier" (U.S. Pat. No. 6,060,839) requires thin films of diamond typically less than 25 microns (0.001") thick. The electron beam amplifier requires that one side of the thin diamond film be coated with a thin conducting layer and exposed to a primary electron beam, while the other side, having NEA, is held at a positive potential with respect to the coated side. In practice the thin diamond film must be bonded over a hole in a physically robust and thermally conductive substrate to facilitate handling, provide electric contact, allow exposure to the primary electron beam, and to remove heat generated by the device in operation. To reduce stress caused by thermal expansion as well as maximize thermal transport, it is best to fabricate the substrate from diamond.

During use as an electron source, the diamond film is heated by the primary electron beam and by internal currents, such that the maximum emission current may be limited by the maximum temperature that can be sustained without damage. The elevated temperature also ensures that molecules such as water or carbon monoxide will not be adsorbed during use.

Implementing the diamond electron beam amplifier thus creates several requirements for the bond and bonding process: The bonding material must be an electric conductor, and, if the diamond substrate is insulating, the bond material must extend from underneath the thin diamond to a point where it can be contacted. The bonding material should not coat the top surface or edges of the thin diamond film, which would create an electric short circuit. The bond must sustain temperatures of at least 400° C. without melting, decomposing or significant sublimation. The sublimation rate should be low enough to prevent the diamond surface from becoming contaminated as the device is operated at high temperature for many hours.

To fabricate bonds for use with a thin diamond electron beam amplifier, we utilized a form of "Transient Liquid Phase" (TLP) bonding. In TLP bonding a low melting point metal and a high melting point metal are each deposited onto the surfaces to be bonded. Then the surfaces are brought into contact while the joint is heated above the lower melting point to create liquid which will flow and fill any gaps. At the elevated temperature the two metals inter-diffuse and/or react to form an alloy or compound with a higher melting point, such that the bond material will no longer melt when heated well above the bonding temperature. In this way a bond that can withstand high temperature is created at low temperature.

We have implemented palladium (Pd) and tin (Sn) as the high and low temperature melting point materials. Sn is chosen because it has a low melting point as well as low vapor pressure. Pd is chosen because it has low vapor pressure, has a relatively high solubility for Sn, and because it is relatively inert, making it chemically compatible with later processing.

Thus after the bond is finished, the Sn is dissolved in the Pd without forming brittle or chemically reactive compounds. Sn melts at 230° C. and has a vapor pressure of $10^{-12}$ torr at 500° C. Pd melts at 1555° C. and has a vapor pressure of $10^{-12}$ torr at 610° C.

Sn is soluble in Pd up to 18 wt %, such that no Sn—Pd intermetallic compounds are formed when the weight fraction of Sn is less than 18%. The vapor pressure of Sn dissolved in Pd is not known; Raoult's law for solutions suggests the dissolved Sn vapor pressure would be reduced to no more than 18% of the value for pure Sn, however because a number of PdSn compounds form, the vapor pressure of the dissolved Sn is likely to be significantly lower than Raoult's law predicts.

Palladium containing up to 18 wt % tin is chemically and physically similar to pure Pd, although its melting point is reduced to 1280° C. The alloy is not attacked by many standard chemicals including organics, ammonium hydroxide+hydrogen peroxide, hydrochloric acid+hydrogen peroxide, hydrofluoric acid, or sulfuric acid. Pure Sn and most common contaminants can be removed using the above solutions. Both pure Pd and the alloy can be etched in hot nitric acid or nitro-hydrochloric acid (aqua-regia).

Analysis of the bow/warp and roughness of the polycrystalline diamond substrate material showed the gap between the film and substrate may be as much as 200 nm, so the Sn layer must be much more than 200 nm thick. In practice we use 500 nm thick Sn layers. To sufficiently dilute the Sn in Pd, the Pd must be at least 2000 nm thick. In practice we use 2500 nm thick Pd layers.

EXAMPLE

Since neither Pd nor Sn will react readily with diamond, we first coat the diamond surfaces in the areas to be bonded with an adhesion layer of Chromium (Cr). The Cr layer also forms an electric contact to the thin diamond film, needed to remove charge generated by the primary electron beam.

The Cr is thin enough to allow the primary electron beam to pass through it without excessive energy loss. The Cr layer thickness can be varied somewhat depending on the intended primary beam energy and current. A thinner layer may be used for very low primary beam energies or a thicker layer can be used to reduce resistive loss.

The Cr coating on the substrate is patterned using a shadow mask; the Cr coating on the thin diamond film is not patterned. Before depositing the Cr using a magnetron sputter source, we remove adsorbed gases from the diamond by heating inside the vacuum chamber to 500° C. until the pressure drops below $2 \times 10^{-7}$ torr. This step ensures the Cr will chemically react with the diamond rather than the adsorbed gas molecules. Then we reduce the diamond temperature to ~200° C. and deposit 20 nm Cr. Deposition should not be carried out at higher temperatures because the Cr may move under the shadow mask before it is adsorbed.

Pd is deposited onto the substrate diamond after the Cr adhesion layer, with the same shadow mask, without breaking vacuum. An initial layer of 300 nm of Pd is deposited on top of the Cr. Then the diamond temperature is brought up briefly to 600° C. to cause the Cr and C to form a physically strong chemical bond and the Cr and Pd to inter-diffuse. The diamond temperature is then reduced back to 200° C. and 2200 nm of Pd is deposited, for a total Pd thickness of 2500 nm.

A very small amount of Pd may get under the shadow mask, and can be removed with a brief nitric acid etch.

Before depositing Sn onto the thin diamond film over the Cr coating, a shadow mask is placed over the film covering the center portion of the film, where the primary electron beam will strike. The shadow mask also keeps the Sn layer away from the film edges, reducing the exposed area and thus reducing the sublimation rate of the bond. Sn is deposited at room temperature, following a vacuum degas at 200° C. to minimize sublimation of the deposited Cr. The Sn layer is deposited to a thickness of 500 nm. The Sn layer must be deposited only shortly (<8 hrs) before bonding, or stored under vacuum or inert gas, such that air exposure and oxidation are minimized.

To create the bond, the two coated pieces are assembled and aligned, then rapidly heated in inert atmosphere. Rapid heating is necessary to cause the Sn to melt before it inter-diffuses with the Pd. Slow heating causes inter-diffusion to occur at the contact points, forming a high melting point alloy without significant adhesion.

To assemble and align the diamond substrate and film, we use a jig, shown in FIG. 1. The substrate is placed on a stainless steel disk provided with posts. Notches cut in the edge of the substrate align with two posts in the disk. A sheet of diamond with similar edge notches and a central hole matching the shape of the diamond flake is placed over the substrate and aligned using the posts. The Sn-coated side of the diamond film is placed over the Pd-coated side of the substrate film and aligned using the diamond sheet. A smaller diamond sheet with a central hole is placed over the film. The assembly is placed on top of a heater made from a molybdenum body in the shape of a hollow cylinder and filled with a tungsten coil heater and alumina potting (Heatwave Labs model 101133). The heater is mounted inside a stainless steel vacuum chamber. A ceramic ball is placed over the hole in the smaller diamond sheet, and a cup-shaped molybdenum weight, bearing on the ball, is placed over the assembly. The sides of the weight extend over the outside of the heater to provide alignment and promote heat transfer. Type K thermocouples are attached to the heater and the weight. The thermocouple attached to the heater is used to monitor the process as described below. The thermocouple attached to the cap shows a substantially lower temperature (approximately half the heater temperature) during the initial heating and approximately 50° C. cooler in steady state. To power the heater, we use a temperature controller (Stanford Research Systems model PTC10) to regulate primary power to a 12.5 V, 20A transformer (~175 W).

The chamber is evacuated below $2 \times 10^{-7}$ torr, the heater is held at 100° C. until the pressure is again below $2 \times 10^{-7}$ torr, then the heater is cooled in vacuum. Prior to the final heating step, the chamber is back-filled with purified Ar gas to 7 torr. Initially we apply full power continuously to the heater, causing the temperature to increase as rapidly as possible. We achieve about 10° C./s or 600° C. in 60 seconds. The heater power is turned off as the heater temperature passes 600° C. The temperature continues to rise to about 615° C., then begins to cool. The heater is allowed to cool to 450° C. and held at 450° C. for 1 hour, then allowed to cool to room temperature.

We use X-ray photoemission (Thermo Scientific model K-Alfa) to check the exposed diamond surface for contamination. Using the heating protocol above we find no contamination on the diamond film after bonding. The large temperature difference between the melting point of Sn (230° C.) and the heater temperature is needed to provide rapid heat transfer between heater and sample. The Ar gas backfill is used to promote faster heat transfer. The backfill pressure is limited to several torr to avoid excessive heat transfer to the chamber walls, which would release gas from the chamber walls. If the peak temperature reaches 700° C. the diamond film may be contaminated with small amounts of evaporated Sn. A peak temperature of 500° C. will result in no bond or an incomplete bond. The 1 hour hold time is thought to be much longer than required to ensure complete and homogeneous inter-diffusion of Pd and Sn. Using the protocol above, it is possible to produce a bonded flake free of metal contamination. If the peak temperature is exceeded, any Sn contamination can be removed by submersion in concentrated sulfuric acid at 200° C. for 60 seconds.

This new bonding process involves the bond materials having very low vapor pressure and the bonding process leaves the exposed surfaces free of contamination to less than 1% of a monolayer. The claimed process might also be used to bond thin diamond for other purposes, for example vacuum windows for radiation (for example, in the microwave through visible frequencies) are also likely to be sensitive to surface contamination. Another application for thin diamond is vacuum windows for x-ray radiation. Coated with a layer of Al or other metal, the diamond films could be used as x-ray anodes that double as x-ray windows.

A very similar process would substitute pure Copper (Cu) or Pd alloys with Cu, Ni, or Pt for pure Pd. Cu is less chemically inert and has higher vapor pressure than Pd; however it is less expensive and will form excellent bonds. Ni:Pd, Pt:Pd, or Ni:Pd:Pt alloys may provide even lower vapor pressure and may reduce the required heating rate. Substituting pure Ni for Pd will form a bond with low vapor pressure, but the Ni and Sn react to form compounds that are relatively brittle and less inert than Pd. An alternative may be to slow the Sn oxidation (and thus allow longer exposure to air) by coating it with a thin layer of Pt.

Many modifications and variations of the present invention are possible in light of the above teachings. It is therefore to be understood that the claimed invention may be practiced otherwise than as specifically described. Any reference to claim elements in the singular, e.g., using the articles "a," "an," "the," or "said" is not construed as limiting the element to the singular.

What we claim is:

1. A method of bonding for thin diamond film providing low vapor pressure at high temperature comprising:
   heating a diamond substrate inside a vacuum chamber to about 500° C.;
   cooling the diamond substrate to a temperature of about 200° C.;
   coating a first surface of the diamond substrate with an adhesion layer of chromium;
   depositing an initial layer of palladium on the adhesion layer of chromium;
   heating the diamond substrate to a temperature of about 600° C.;
   allowing the chromium and the diamond substrate to form a chemical bond;
   inter-diffusing the adhesion layer of chromium and the initial layer of palladium;
   cooling the diamond substrate to about 200° C.;
   depositing a second layer of palladium;
   placing a shadow mask on a thin diamond film;
   degassing the vacuum at about 200° C. and minimizing sublimation of the deposited chromium;
   depositing a tin layer onto the thin diamond film;
   assembling the tin layer on the thin diamond film with the second palladium layer;
   heating the tin layer on the thin diamond film and the second palladium layer;
   melting the tin layer; and
   bonding the thin diamond film to the diamond substrate.

2. The method of bonding for thin diamond film providing low vapor pressure at high temperature of claim 1 wherein the step of heating a diamond substrate inside a vacuum chamber further includes the step of removing adsorbed gases from the diamond substrate.

3. The method of bonding for thin diamond film providing low vapor pressure at high temperature of claim 2 wherein the step of heating a diamond substrate inside a vacuum chamber further includes the step of heating inside the vacuum chamber to about 500° C. until the pressure drops below about $2\times10^{-7}$ torr.

4. The method of bonding for thin diamond film providing low vapor pressure at high temperature of claim 1 wherein the step of coating a first surface of the diamond substrate with an adhesion layer of chromium further includes the step of using a shadow mask to coat the chromium on the diamond substrate.

5. The method of bonding for thin diamond film providing low vapor pressure at high temperature of claim 1 wherein the step of coating a first surface of the diamond substrate with an adhesion layer of chromium results in an adhesion layer of chromium that is about 20 nm.

6. The method of bonding for thin diamond film providing low vapor pressure at high temperature of claim 1 further including the step of forming an electric contact between the chromium layer and the thin diamond film.

7. The method of bonding for thin diamond film providing low vapor pressure at high temperature of claim 1 wherein the step of depositing palladium further includes the step of using a shadow mask and is completed without breaking the vacuum.

8. The method of bonding for thin diamond film providing low vapor pressure at high temperature of claim 1 wherein the step of depositing palladium further includes the step of depositing an initial layer of about 300 nm of palladium on the adhesion layer of chromium.

9. The method of bonding for thin diamond film providing low vapor pressure at high temperature of claim 1 wherein the step of depositing a second layer of palladium further includes the step of depositing about 2200 nm of palladium and thereby resulting in a total palladium thickness of about 2500 nm.

10. The method of bonding for thin diamond film providing low vapor pressure at high temperature of claim 1 further including the step of removing excess palladium with a nitric acid etch.

11. The method of bonding for thin diamond film providing low vapor pressure at high temperature of claim 1 wherein the tin layer deposited has a thickness of about 500 nm.

12. The method of bonding for thin diamond film providing low vapor pressure at high temperature of claim 11 wherein the step of depositing a tin layer occurs within about 8 hours before bonding.

13. The method of bonding for thin diamond film providing low vapor pressure at high temperature of claim 1 further including the steps of storing under vacuum or inert gas after the step of depositing a tin layer and preventing exposure to air or oxidation.

14. The method of bonding for thin diamond film providing low vapor pressure at high temperature of claim 1 further including the steps of;

evacuating the chamber below about $2 \times 10^{-7}$ torr;

maintaining a temperature of about 100° C. until the pressure is below about $2 \times 10^{-7}$ torr; and cooling in vacuum.

15. The method of bonding for thin diamond film providing low vapor pressure at high temperature of claim 14 further including the steps of:

back-filling the chamber with Ar gas to about 78 torr prior to the step of heating the tin layer;

heating at a rate of about 10° C./s or about 600° C. in about 60 seconds;

cooling to about 450° C.;

holding the temperature at about 450° C. for about 1 hour; and cooling to room temperature.

* * * * *